(12) United States Patent
Ueno

(10) Patent No.: US 11,562,689 B2
(45) Date of Patent: Jan. 24, 2023

(54) DISPLAY DEVICE

(71) Applicant: SHARP KABUSHIKI KAISHA, Sakai (JP)

(72) Inventor: Tetsuya Ueno, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/440,170

(22) PCT Filed: Mar. 25, 2019

(86) PCT No.: PCT/JP2019/012591
§ 371 (c)(1),
(2) Date: Sep. 16, 2021

(87) PCT Pub. No.: WO2020/194467
PCT Pub. Date: Oct. 1, 2020

(65) Prior Publication Data
US 2022/0208928 A1 Jun. 30, 2022

(51) Int. Cl.
*G09G 3/3225* (2016.01)
*G09G 3/3275* (2016.01)
*H01L 27/32* (2006.01)

(52) U.S. Cl.
CPC ......... *G09G 3/3225* (2013.01); *G09G 3/3275* (2013.01); *H01L 27/3276* (2013.01); *G09G 2300/0426* (2013.01); *G09G 2300/0809* (2013.01); *G09G 2310/0297* (2013.01); *G09G 2310/08* (2013.01); *G09G 2320/0233* (2013.01)

(58) Field of Classification Search
CPC ...... G09G 3/3225; G09G 3/3275; G09G 3/20; G09G 3/3233; G09G 2300/0426; G09G 2300/0809; G09G 2310/0297; G09G 2310/08; G09G 2320/0233; G09F 9/30; G09F 9/302; H01L 27/3276
See application file for complete search history.

(56) References Cited

U.S. PATENT DOCUMENTS

| | | | |
|---|---|---|---|
| 2012/0056531 A1* | 3/2012 | Park | G09G 3/3233 313/506 |
| 2013/0234917 A1* | 9/2013 | Lee | H01L 27/3216 345/82 |
| 2014/0071175 A1* | 3/2014 | Yang | G09G 3/20 345/690 |
| 2018/0174511 A1* | 6/2018 | Kim | H01L 27/3218 |
| 2018/0277040 A1* | 9/2018 | Lee | H01L 51/5203 |
| 2019/0237518 A1* | 8/2019 | Sun | H01L 27/3218 |

* cited by examiner

*Primary Examiner* — David Tung
(74) *Attorney, Agent, or Firm* — ScienBiziP, P.C.

(57) ABSTRACT

A display device includes five light-emitting layers including four light-emitting layers arranged in two rows and two columns, and one light-emitting layer diagonally adjacent to each of the four light-emitting, layers, wherein three subpixel circuits corresponding to the one light-emitting layer and two light-emitting layers adjacent in a row direction among the five light-emitting layers are connected to an identical scanning signal line, and four subpixel circuits corresponding to the one light-emitting layer and three light-emitting layers diagonally adjacent to the one light-emitting layer among the five light-emitting layers are connected to four different data signal lines.

18 Claims, 8 Drawing Sheets

DISPLAY DEVICE

TECHNICAL FIELD

The disclosure relates to a display device.

BACKGROUND ART

PTL 1 discloses a connection relationship between red subpixels, green subpixels, and blue subpixels in a delta array and data lines and scanning lines in an OLED display device.

CITATION LIST

Patent Literature

PTL 1: US 2018/0174511 A

SUMMARY

Technical Problem

In the configuration of PTL 1, for example, because the drive frequencies of data lines connecting to green subpixels and data lines connecting to blue subpixels are the same, there is a risk that the charge of subpixel circuits corresponding to, for example, blue light-emitting layers (generally low luminous efficiency) may be insufficient, and the luminance of the blue subpixels may decrease.

Solution to Problem

A display device according to an embodiment of the disclosure is a display device including a plurality of data signal lines, a plurality of scanning signal lines, and a plurality of subpixels, wherein each subpixel of the plurality of subpixels includes a first electrode, a cover film including an opening portion exposing the first electrode, a light-emitting layer having an island shape, a second electrode, and a subpixel circuit provided at an intersection of the corresponding data signal line and the corresponding scanning signal line, the plurality of subpixels include: a first subpixel circuit and a second subpixel circuit connected to an nth scanning signal line; a third subpixel circuit and a fourth subpixel circuit connected to an (n+1)th scanning signal line; a fifth subpixel circuit and a sixth subpixel circuit connected to an (n+2)th scanning signal line; a seventh subpixel circuit and an eighth subpixel circuit connected to an (n+3)th scanning signal line; a first light-emitting layer having an island shape and corresponding to the first subpixel circuit; a second light-emitting layer having an island shape and corresponding to the second subpixel circuit; a third light-emitting layer having an island shape and corresponding to the third subpixel circuit; a fourth light-emitting layer having an island shape and corresponding to the fourth subpixel circuit; a fifth light-emitting layer having an island shape and corresponding to the fifth subpixel circuit; a sixth light-emitting layer having an island shape and corresponding to the sixth subpixel circuit; a seventh light-emitting layer having an island shape and corresponding to the seventh subpixel circuit; and an eighth light-emitting layer having an island shape and corresponding to the eighth subpixel circuit, the first light-emitting layer, the third light-emitting layer, the fifth light-emitting layer, and the seventh light-emitting layer are adjacent in a column direction, the second light-emitting layer, the fourth light-emitting layer, the sixth light-emitting layer, and the eighth light-emitting layer are adjacent in a column direction, the first light-emitting layer is diagonally adjacent to the second light-emitting layer, the third light-emitting layer is diagonally adjacent to the second light-emitting layer and the fourth light-emitting layer, the fifth light-emitting layer is diagonally adjacent to the fourth light-emitting layer and the sixth light-emitting layer, the seventh light-emitting layer is diagonally adjacent to the sixth light-emitting layer and the eighth light-emitting layer, the first light-emitting layer and the fifth light-emitting layer are configured to emit light of a first color, the third light-emitting layer and the seventh light-emitting layer are configured to emit light of a second color different from the first color, the second light-emitting layer, the fourth light-emitting layer, the sixth light-emitting layer, and the eighth light-emitting layer are configured to emit light of a third color different from the first color and the second color, the plurality of data signal lines include a first data signal line, a second data signal line, and a third data signal line, the first subpixel circuit and the fifth subpixel circuit are connected to the first data signal line, the third subpixel circuit and the seventh subpixel circuit are connected to the second data signal line, and the second subpixel circuit, the fourth subpixel circuit, the sixth subpixel circuit, and the eighth subpixel circuit are connected to the third data signal line.

Advantageous Effects of Disclosure

According to an aspect of the disclosure, the luminance shift of subpixels including light-emitting layers emitting light of the first color or the second color can be reduced.

DESCRIPTION OF EMBODIMENTS

First Embodiment

Figure 1:
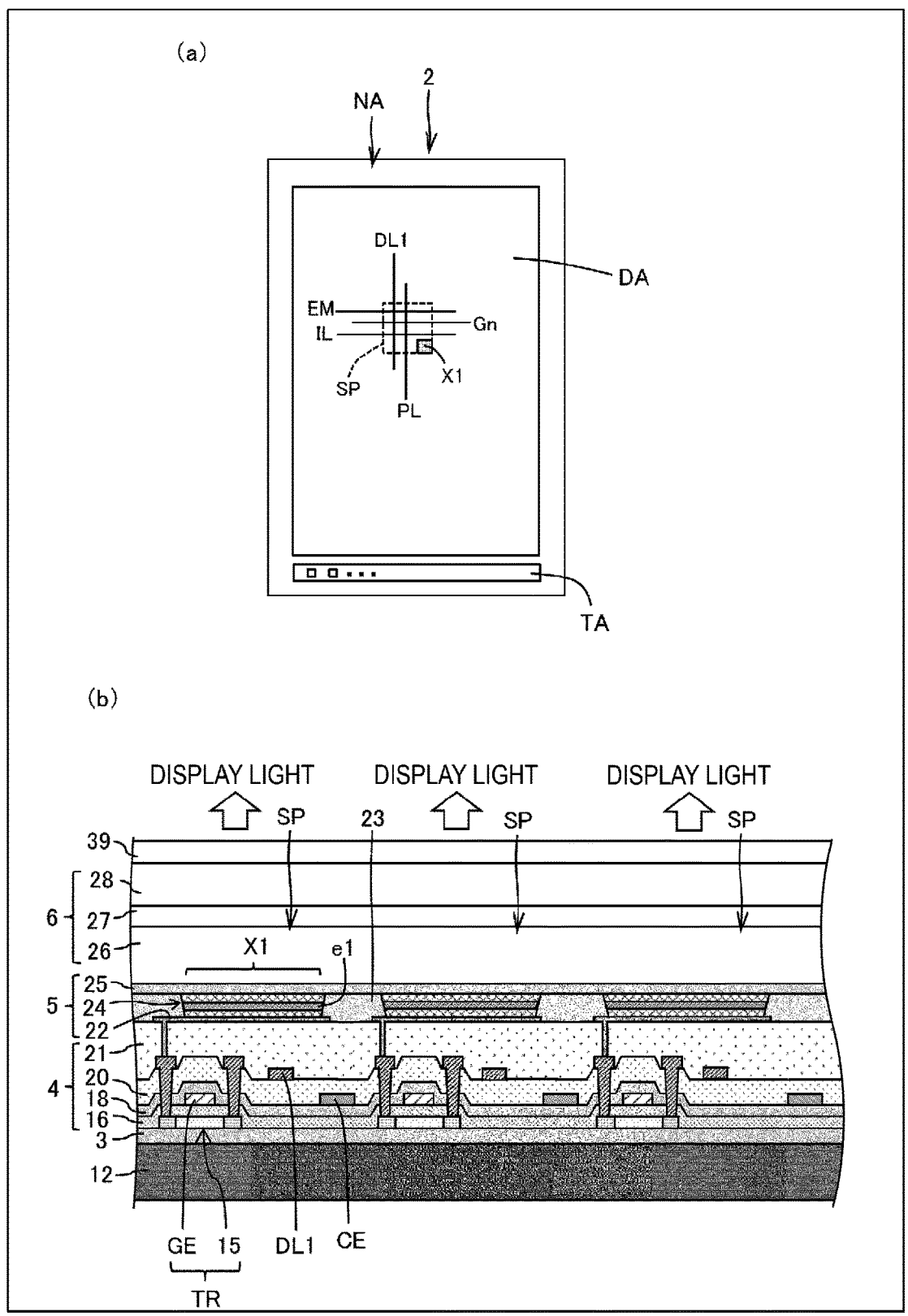
FIG. 1(a) is a schematic plan view illustrating a configuration of a display device according to a first embodiment.
FIG. 1(b) is a cross-sectional view illustrating a configuration of a display portion.
Figure 2:
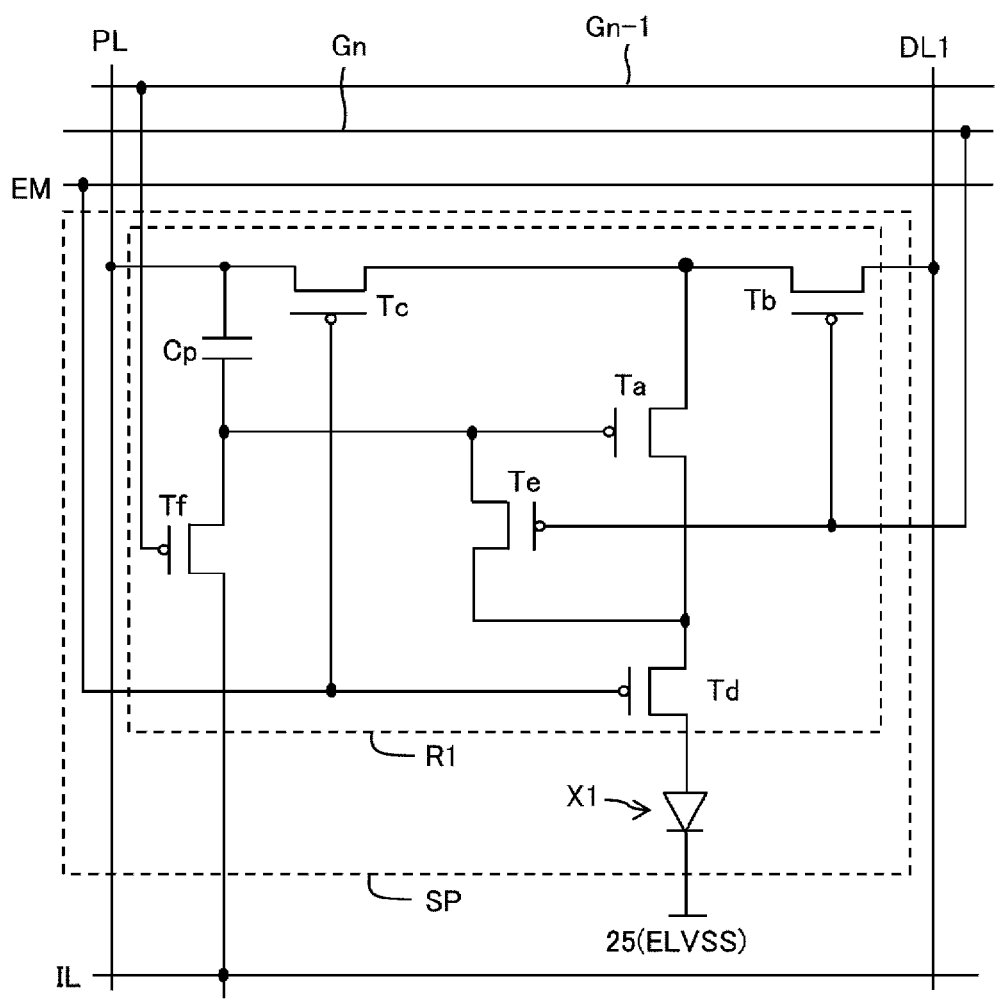
FIG. 2 is a circuit diagram illustrating a configuration of a subpixel.

FIG. 1(a) is a schematic plan view illustrating a configuration of a display device according to the first embodiment, and FIG. 1(b) is a cross-sectional view illustrating a configuration of a display portion. FIG. 2 is a circuit diagram illustrating a configuration of a subpixel.

In a display device 2, a barrier layer 3, a TFT layer 4, a top-emitting type light-emitting element layer 5, a sealing layer 6, and a function film 39 are provided in this order on a substrate 12, and a plurality of subpixels SP (R1) are formed in the display region DA. A terminal portion TA for mounting an electronic circuit board (IC chip, FPC, or the like) is formed in the frame region NA surrounding the display region DA.

The substrate 12 may be a glass substrate or a flexible substrate including a resin film such as polyimide. The flexible substrate can also be formed by two layer resin films and an inorganic insulating film sandwiched therebetween. A film such as PET may be applied to the bottom surface of the substrate 12.

The barrier layer 3 is a layer that inhibits foreign matter such as water and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CVD), for example.

As illustrated in FIG. 1(b), the TFT (thin film transistor) layer 4 includes a semiconductor layer (including a semiconductor film 15) as an upper layer overlying the barrier layer 3, an inorganic insulating film 16 (a gate insulating film) as an upper layer overlying the semiconductor layer, a first metal layer (including a gate electrode GE) as an upper layer overlying the inorganic insulating film 16, an inorganic insulating film 18 as an upper layer overlying the first metal layer, a second metal layer (including a capacitance electrode CE) as an upper layer overlying the inorganic insulating film 18, an inorganic insulating film 20 as an upper layer overlying the second metal layer, a third metal layer (including a data signal line DL1) as an upper layer overlying the inorganic insulating film 20, and a flattening film 21 as an upper layer overlying the third metal layer.

The semiconductor layer is constituted by, for example, amorphous silicon, LTPS (low-temperature polycrystalline silicon), or an oxide semiconductor, and a thin film transistor TR is configured to include the gate electrode GE and the semiconductor film 15.

In the display region DA, a light-emitting element and a subpixel circuit for controlling the light-emitting element are provided for each subpixel SP, and a subpixel circuit and a wiring line connected to the subpixel circuit are formed in the TFT layer 4. Examples of the wiring line that is connected to the subpixel circuit include, for example, a scanning signal line Gn and a light emission control line EM formed in the first metal layer, an initialization power source line IL formed in the second metal layer, and the data signal line DL1 and a high-voltage side power source line PL formed in the third metal layer.

As illustrated in FIG. 2, for example, the first subpixel circuit R1 includes a drive transistor Ta that controls the current of a light-emitting element X1, a write transistor Tb that electrically connects to the data signal line DL1 and an nth scanning signal line Gn, a light emission control transistor Td that electrically connects to the light emission control line EM, and the like. The source terminal of the drive transistor Ta is connected to the data signal line DL1 via the write transistor Tb, and the gate terminal of the drive transistor Ta is connected to the high-voltage side power source line PL via a capacitance element Cp. A data signal (analog signal according to a gray scale) is supplied to the data signal line DL1 from the data signal line drive circuit, and the voltage corresponding to the data signal is charged to the capacitance element Cp. As a result, the current value flowing in the light-emitting element X1 is set to a value corresponding to the data signal.

The first metal layer, the second metal layer, and the third metal layer are each formed of a single layer film or a multi-layered film of metal, the metal including at least one of aluminum, tungsten, molybdenum, tantalum, chromium, titanium, and copper, for example.

Each of the inorganic insulating films 16, 18, and 20 can be formed of, for example, a silicon oxide (SiOx) film or a silicon nitride (SiNx) film, or a layered film of these, formed by using a CVD method. The flattening film 21 can be formed of, for example, a coatable organic material such as polyimide or acrylic resin.

The light-emitting element layer 5 includes a first electrode (lower electrode) 22 as an upper layer overlying the flattening film 21, an insulating cover film 23 configured to cover an edge of the first electrode 22, an electroluminescence (EL) layer 24 as an upper layer overlying the cover film 23, and a second electrode (upper electrode) 25 as an upper layer overlying the EL layer 24. The cover film 23 is formed by applying an organic material such as a polyimide resin or an acrylic resin and then patterning the organic material by photolithography, for example.

A plurality of light-emitting elements including the light-emitting element X1 are formed in the light-emitting element layer 5, and each of the light-emitting elements includes an island shaped first electrode 22, an EL layer 24, and a second electrode 25. The second electrode 25 is a solid-like common electrode common to the plurality of light-emitting elements.

The light-emitting element X1 may be, for example, an OLED (organic light-emitting diode) including an organic layer as a light-emitting layer e1, or may be a QLED (quantum dot light-emitting diode) including a quantum dot layer as the light-emitting layer e1.

For example, the EL layer 24 is formed by layering a hole injection layer, a hole transport layer, the light-emitting layer e1, an electron transport layer, and an electron injection layer in this order, from the lower layer side. The light-emitting layer e1 is formed into an island shape for each subpixel in the opening portion of the cover film 23 exposing the first electrode 22 by vapor deposition, an ink-jet method, or photolithography. Other layers are formed in an island shape or a solid-like shape (common layer). A configuration is also possible in which one or more layers are not formed among the hole injection layer, the hole transport layer, the electron transport layer, and the electron injection layer (described later).

The first electrode 22 (anode) is formed by layering of, for example, Indium Tin Oxide (ITO) and Ag (silver) or an alloy including Ag, and has light reflectivity. The second electrode 25 (cathode) is formed of, for example, a magnesium silver alloy and has high optical transparency.

In a case where the light-emitting element X1 is an OLED, positive holes and electrons recombine inside the light-emitting layer in response to a drive current between the first electrode 22 and the second electrode 25, and light is emitted when the excitons generated in this manner transition to a ground state. Because the second electrode 25 is highly transparent and the first electrode 22 has light reflectivity, the light emitted from the EL layer 24 is directed upward to configure a top-emitting structure.

In a case where the light-emitting element X1 is a QLED, positive holes and electrons recombine inside the light-emitting layer in response to a drive current between the first electrode 22 and the second electrode 25, and light (fluorescence) is emitted when the excitons generated in this manner transition from the conduction band of the quantum dot to the valence band.

A light-emitting element (such as an inorganic light-emitting diode) other than the OLED or QLED may be formed in the light-emitting element layer 5.

The sealing layer 6 is transparent, and includes an inorganic sealing film 26 formed on the second electrode 25, an organic film 27 as an upper layer overlying the inorganic sealing film 26, and an inorganic sealing film 28 as an upper layer overlying the organic film 27. The sealing layer 6 covering the light-emitting element layer 5 inhibits foreign matter such as water and oxygen from penetrating the light-emitting element layer 5.

The organic film 27 has a flattening effect and is transparent, and can be formed by, for example, ink-jet application using a coatable organic material. The inorganic sealing films 26 and 28 are inorganic insulating films, and can be formed of a silicon oxide film, a silicon nitride film, a silicon oxynitride film, or a layered film of these, formed by CVD, for example.

The function film 39 has at least one of an optical compensation function, a touch sensor function, a protection function, and the like.

First Embodiment

Figure 3:
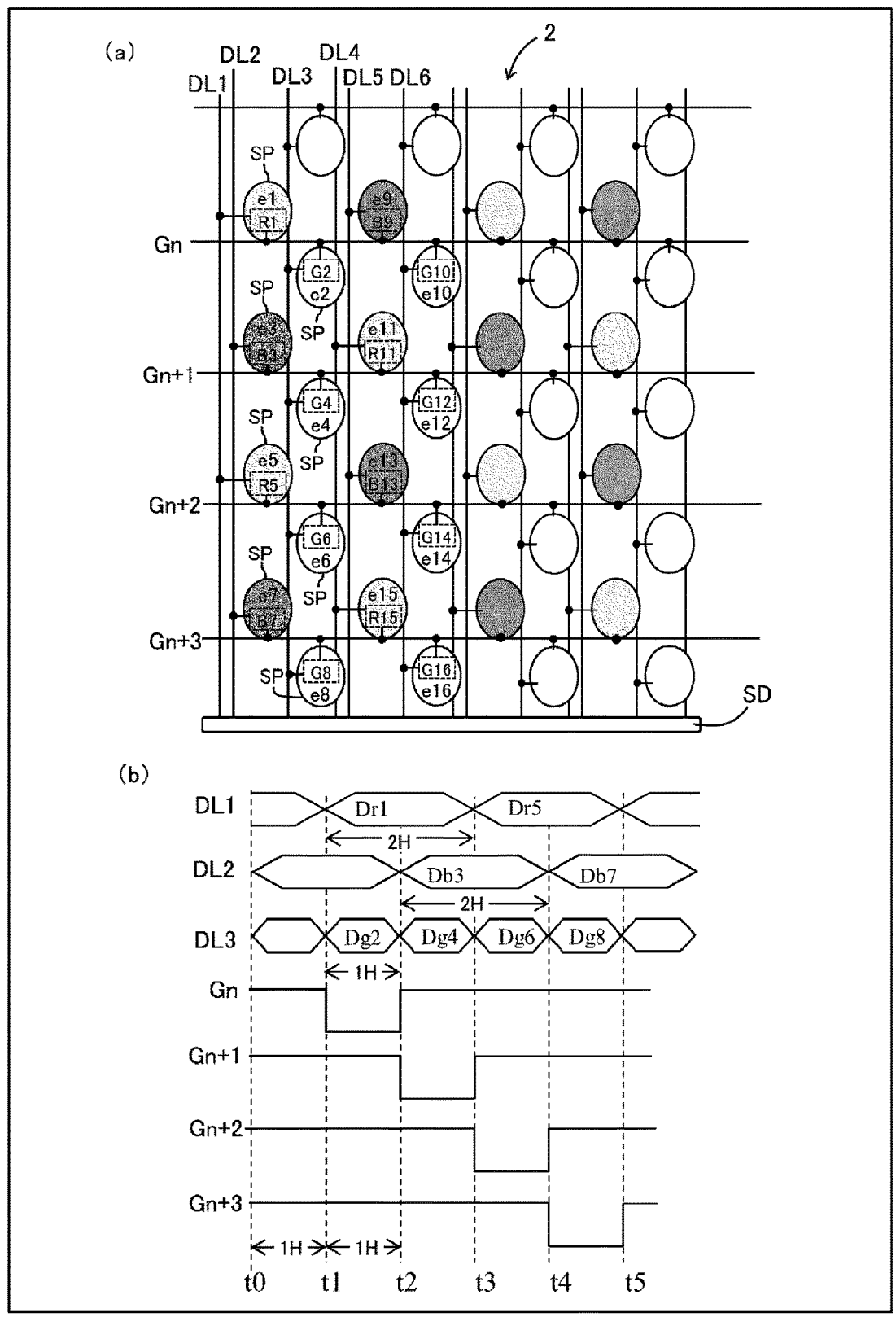
FIG. 3(a) is a schematic diagram illustrating a connection relationship between subpixel circuits, data signal lines, and scanning signal lines according to the first embodiment.
FIG. 3(b) is a timing chart illustrating a method of driving the data signal lines and the scanning signal lines.

FIG. 3(a) is a schematic diagram illustrating a connection relationship between subpixel circuits, data signal lines, and scanning signal lines according to the first embodiment, and FIG. 3(b) is a timing chart illustrating a method of driving the data signal lines and the scanning signal lines. In FIG. 3, the waveforms of the data signals are described in a simplified schematic description, but the actual data signals change exponentially based on the time constant.

The display device 2 is provided with a plurality of data signal lines (DL1 to DL6) extending in the column direction (vertical), a plurality of scanning signal lines Gn to Gn+3 extending in the row direction (horizontal), a plurality of subpixels SP, and a data signal line drive circuit SD that drives the plurality of data signal lines (DL1 to DL6).

The plurality of subpixels SP include a first subpixel circuit R1, a second subpixel circuit G2, and a ninth subpixel circuit B9 that connect to the nth scanning signal line Gn; a third subpixel circuit B3 and a fourth subpixel circuit G4 that connect to the (n+1)th scanning signal line Gn+1; a fifth subpixel circuit R5 and a sixth subpixel circuit G6 that connect to the (n+2)th scanning signal line; a seventh subpixel circuit B7 and an eighth subpixel circuit G8 that connect to the (n+3)th scanning signal line; an island-shaped first light-emitting layer e1 corresponding to the first subpixel circuit R1; an island-shaped second light-emitting layer e2 corresponding to the second subpixel circuit G2; an island-shaped third light-emitting layer e3 corresponding to the third subpixel circuit B3; an island-shaped fourth light-emitting layer e4 corresponding to the fourth subpixel circuit G4; an island shaped fifth light-emitting layer e5 corresponding to the fifth subpixel circuit R5; an island shaped sixth light-emitting layer e6 corresponding to the sixth subpixel circuit G6; an island-shaped seventh light-emitting layer e7 corresponding to the seventh subpixel circuit B7; an island shaped eighth light-emitting layer e8 corresponding to the eighth subpixel circuit G8; and an island shaped ninth light-emitting layer e9 corresponding to the ninth subpixel circuit B9.

The first light-emitting layer e1 and the ninth light-emitting layer e9 are adjacent to each other in the row direction, the first light-emitting layer e1, the third light-emitting layer e3, the fifth light-emitting layer e5, and the seventh light-emitting layer e7 are adjacent in the column direction, and the second light-emitting layer e2, the fourth light-emitting layer e4, the sixth light-emitting layer e6, and the eighth light-emitting layer e8 are adjacent in the column direction.

The first light-emitting layer e1 is diagonally adjacent to the second light-emitting layer e2, the second light-emitting layer e2 is diagonally adjacent to the first light-emitting layer e1 and the ninth light-emitting layer e9, the third light-emitting layer e3 is diagonally adjacent to the second light-emitting layer e2 and the fourth light-emitting layer e4, the fifth light-emitting layer e5 is diagonally adjacent to the fourth light-emitting layer e4 and the sixth light-emitting layer e6, and the seventh light-emitting layer e7 is diagonally adjacent to the sixth light-emitting layer e6 and the eighth light-emitting layer e8.

The first light-emitting layer e1 and the fifth light-emitting layer e5 emit light of a first color (for example, red color), the third light-emitting layer e3, the seventh light-emitting layer e7, and the ninth light-emitting layer e9 emit light of a second color different from the first color (for example, blue color), and the second light-emitting layer e2, the fourth light-emitting layer e4, the sixth light-emitting layer e6, and the eighth light-emitting layer e8 emit light of a third color different from the first color and the second color (for example, green color).

The first subpixel circuit R1 and the fifth subpixel circuit R5 are connected to the first data signal line DL1, the third subpixel circuit B3 and the seventh subpixel circuit B7 are connected to the second data signal line DL2, the second subpixel circuit G2, the fourth subpixel circuit G4, the sixth subpixel circuit G6, and the eighth subpixel circuit G8 are connected to the third data signal line DL3, and the ninth subpixel circuit B9 is connected to the fifth data signal line DL5. In other words, the first subpixel circuit R1, the second subpixel circuit G2, the third subpixel circuit B3, and the ninth subpixel circuit B9 are respectively connected to four different data signal lines corresponding to each (DL1, DL3, DL2, and DL5).

As illustrated in FIG. 3(b), the drive frequency of the first data signal line DL1 and the drive frequency of the second data signal line DL2 are half the drive frequency of the third data signal line DL3. For the driving of the first data signal line DL1 and the driving of the second data signal line DL2, each drive period is 2H, and the phases are shifted by 1H to each other. The drive period of the third data signal line DL3 is 1H, and each drive period of the second data signal line DL2 and two consecutive drive periods of the third data signal line DL3 are synchronized.

The drive period is a period from a start timing of supplying a data signal (analog signal voltage) corresponding to a certain gray scale data to the data signal line until a start timing of supplying a data signal corresponding to a next gray scale data. Data signals Dr1 and Dr5 written to the subpixel circuits R1 and R5 are sequentially supplied from t0 to the data signal line DL1, data signals Db3 and Db7 written to the subpixel circuits B3 and B7 are sequentially supplied from t1 (1H after t0) to the data signal line DL2, and data signals Dg2, Dg4, Dg6, and Dg8 written to the subpixel circuits G2, G4, G6, and G8 are sequentially supplied from t1 to the data signal line DL3.

In the first embodiment, the data signal line drive circuit SD is controlled such that the start timing of supplying the data signal Dr5 written to the fifth subpixel circuit R5 to the first data signal line DL1 is later than the start timing t2 (1H after t1) of supplying the data signal Dg4 written to the fourth subpixel circuit G4 to the third data signal line DL3, and is the same as the start timing t3 (1H after t2) of supplying the data signal Dg6 written to the sixth subpixel circuit G6 to the third data signal line DL3.

For writing to the fifth subpixel circuit R5, the data signal Dr5 can be written to the fifth subpixel circuit R5 at t3 to t4 (1H after t3) at which the scanning signal line Gn+2 is selected, after the data signal line DL1 has been charged with the data signal Dr1 of the same color signal before t3. Thus, the charging rate of the fifth subpixel circuit R5 including the fifth light-emitting layer e5 of red light emission can be increased, and the luminance shift of the red light (offset from the luminance corresponding to the data signal) can be reduced. Even if the return of the pulse of the scanning signal line Gn+2 is slow, there is no risk that the next data signal may be picked up.

The data signal line drive circuit SD is controlled such that the start timing of supplying the data signal written to the seventh subpixel circuit B7 to the second data signal line DL2 is later than the start timing t3 of supplying the data signal Dg6 written to the sixth subpixel circuit G6 to the third data signal line DL3, and is the same as the start timing 14 of supplying the data signal Dg8 written to the eighth subpixei circuit G8 to the third data signal line DL3.

For writing of the data signal Db7 to the seventh subpixel circuit B7, the same data signal Db7 can be written to the seventh subpixel circuit B7 at t4 to t5 at which the scanning signal line Gn+3 is selected, after the data signal line DL2 has been charged with the data signal Db3 of the same color signal before t4. Thus, the charging rate of the seventh subpixel circuit B7 including the seventh light-emitting layer e7 of blue light emission (generally having low luminous efficiency) can be increased, and the luminance shift of the blue light can be reduced. Even if the return of the pulse of the scanning signal line Gn+3 is slow, there is no risk that the next data signal may be picked up.

For each of the first data signal line DL1 and the second data signal line DL2, the corresponding data signal may be supplied in the first 1H of the one period 2H, and the supply of the data signal may be stopped in the second 1H, or the corresponding data signal may be supplied over all of the one period 2H.

The plurality of subpixels SP of FIG. 3 include a 10th subpixel circuit G10 that connects to the nth scanning signal line Gn; a 11th subpixel circuit R11 and a 12th subpixel circuit G12 that connect to the (n+1)th scanning signal line Gn+1; a 13th subpixel circuit B13 and a 14th subpixel circuit G14 that connect to the (n+2)th scanning signal line Gn+2; a 15th subpixel circuit R15 and a 16th subpixel circuit G16 that connect to the (n+3)th scanning signal line Gn+3; an island-shaped 10th light-emitting layer e11) corresponding to the 10th subpixel circuit G10; an island-shaped 11th light-emitting layer e11 corresponding to the 11th subpixel circuit R11; an island-shaped 12th light-emitting layer e12 corresponding to the 12th subpixel circuit G12; an island-shaped 13th light-emitting layer e13 corresponding to the 13th subpixel circuit B13;

an island shaped 14th light-emitting layer e14 corresponding to the 14th subpixel circuit G14; an island shaped 15th light-emitting layer e15 corresponding to the 15th subpixel circuit R15; and an island-shaped 16th light-emitting layer e16 corresponding to the 16th subpixel circuit G16.

The ninth light-emitting layer e9, the 11th light-emitting layer e11, the 13th light-emitting layer e13, and the 15th light-emitting layer e15 are adjacent in the column direction, the 10th light-emitting layer e10, the 12th light-emitting layer e12, the 14th light-emitting layer e14, and the 16th light-emitting layer e16 are adjacent in the column direction, the ninth light-emitting layer e9 is diagonally adjacent to the second light-emitting layer e2 and the 10th light-emitting layer e10, the 11th light-emitting layer e11 is diagonally adjacent to the second light-emitting layer e2, the fourth light-emitting layer e4, the 10th light-emitting layer e10, and the 12th light-emitting layer e12, the 13th light-emitting layer e13 is diagonally adjacent to the fourth light-emitting layer e4, the sixth light-emitting layer e6, and the 12th light-emitting layer e12, and the 14th light-emitting layer e14, and the 15th light-emitting layer e15 is diagonally adjacent to the sixth light-emitting layer e6, the eighth light-emitting layer e8, the 14th light-emitting layer e14, and the 16th light-emitting layer e16.

The 11th light-emitting layer e11 and the 15th light-emitting layer e15 emit light of a first color (for example, red color), the 13th light-emitting layer e13 emits light of a second color (for example, blue color), and the 10th light-emitting layer e10, the 12th light-emitting layer e12, the 14th light-emitting layer e14, and the 16th light-emitting layer e16 emit light of a third color (for example, green color).

The 11th subpixel circuit R11 and the 15th subpixel circuit R15 are connected to the fourth data signal line DL4, the ninth subpixel circuit B9 and the 13th subpixel circuit B13 are connected to the fifth data signal line DL5, and the 10th subpixel circuit G10, the 12th subpixel circuit G12, the 14th subpixel circuit G14, and the 16th subpixel circuit G16 are connected to the sixth data signal line DL6.

Second Embodiment

FIG. 4(a) is a schematic diagram illustrating a connection relationship between subpixel circuits, data signal lines, and scanning signal lines according to the second embodiment, and FIG. 4(b) is a timing chart illustrating a method of driving the data signal lines and the scanning signal lines. In the second embodiment, the configuration of the subpixel columns at the third column and the seventh column from the left in FIG. 3(a) is changed (no change is made to the subpixel circuits R1, G2, B3, G4, R5 G6, B7, and G8).

Figure 4:
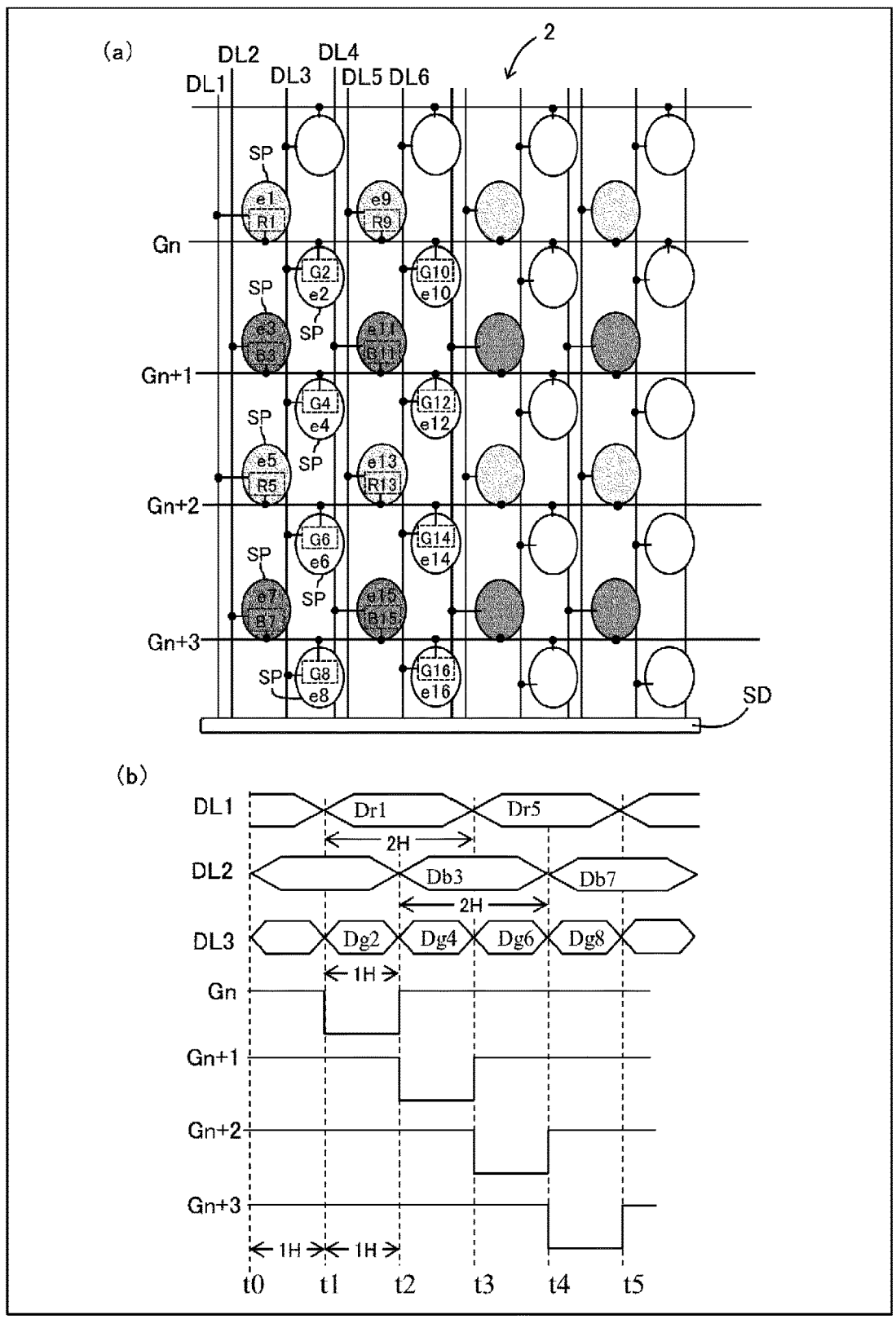
FIG. 4(a) is a schematic diagram illustrating a connection relationship between subpixel circuits, data signal lines, and scanning signal lines according to a second embodiment.
FIG. 4(b) is a timing chart illustrating a method of driving the data signal lines and the scanning signal lines.

The plurality of subpixels SP of FIG. 4 include a ninth subpixel circuit R9 and a 10th subpixel circuit G10 that connect to the nth scanning signal line Gn; a 11th subpixel circuit B11 and a 12th subpixel circuit G12 that connect to the (n+1)th scanning signal line Gn+1; a 13th subpixel circuit R13 and a 14th subpixel circuit G14 that connect to the (n+2)th scanning signal line Gn+2; a 15th subpixel circuit B15 and a 16th subpixel circuit G16 that connect to the (n+3)th scanning signal line Gn+3; an island-shaped ninth light-emitting layer e9 corresponding to the ninth subpixel circuit R9; an island-shaped 10th light-emitting layer e11) corresponding to the 10th subpixel circuit G10; an island-shaped 11th light-emitting layer e11 corresponding to the 11th subpixel circuit B11; an island-shaped 12th light-emitting layer e12 corresponding to the 12th subpixel circuit G12; an island-shaped 13th light-emitting layer e13 corresponding to the 13th subpixel circuit R13;

an island shaped 14th light-emitting layer e14 corresponding to the 14th subpixel circuit G14; an island shaped 15th light-emitting layer e15 corresponding to the 15th subpixel circuit B15; and an island-shaped 16th light-emitting layer e16 corresponding to the 16th subpixel circuit G16.

The ninth light-emitting layer e9, the 11th light-emitting layer e11, the 13th light-emitting layer e13, and the 15th light-emitting layer e15 are adjacent in the column direction, the 10th light-emitting layer e10, the 12th light-emitting layer e12, the 14th light-emitting layer e14, and the 16th light-emitting layer e16 are adjacent in the column direction, the ninth light-emitting layer e9 is diagonally adjacent to the second light-emitting layer e2 and the 10th light-emitting layer e10, the 11th light-emitting layer e11 is diagonally adjacent to the second light-emitting layer e2, the fourth light-emitting layer e4, the 10th light-emitting layer e10, and the 12th light-emitting layer e12, the 13th light-emitting layer e13 is diagonally adjacent to the fourth light-emitting layer e4, the sixth light-emitting layer e6, and the 12th light-emitting layer e12, and the 14th light-emitting layer e14, and the 15th light-emitting layer e15 is diagonally adjacent to the sixth light-emitting layer e6, the eighth light-emitting layer e8, the 14th light-emitting layer e14, and the 16th light-emitting layer e16.

The ninth light-emitting layer e9 and the 13th light-emitting layer e13 emit light of a first color (for example, red color), the 11th light-emitting layer e11 and the 15th light-emitting layer e15 emit light of a second color (for example, blue color), and the 10th light-emitting layer e10, the 12th light-emitting layer e12, the 14th light-emitting layer e14, and the 16th light-emitting layer e16 emit light of a third color (for example, green).

The 11th subpixel circuit B11 and the 15th subpixel circuit B15 are connected to the fourth data signal line DL4, the ninth subpixel circuit R9 and the 13th subpixel circuit R13 are connected to the fifth data signal line DL5, and the 10th subpixel circuit G10, the 12th subpixel circuit G12, the 14th subpixel circuit G14, and the 16th subpixel circuit G16 are connected to the sixth data signal line DL6. The first subpixel circuit R1, the second subpixel circuit G2, the third subpixel circuit B3, and the ninth subpixel circuit R9 are respectively connected to four different data signal lines corresponding to each (DL1, DL3, DL2, and DL5).

As illustrated in FIG. 4(b), also in the second embodiment, the luminance shift of red light and blue light can be reduced similarly to the first embodiment.

Third Embodiment

Figure 5:
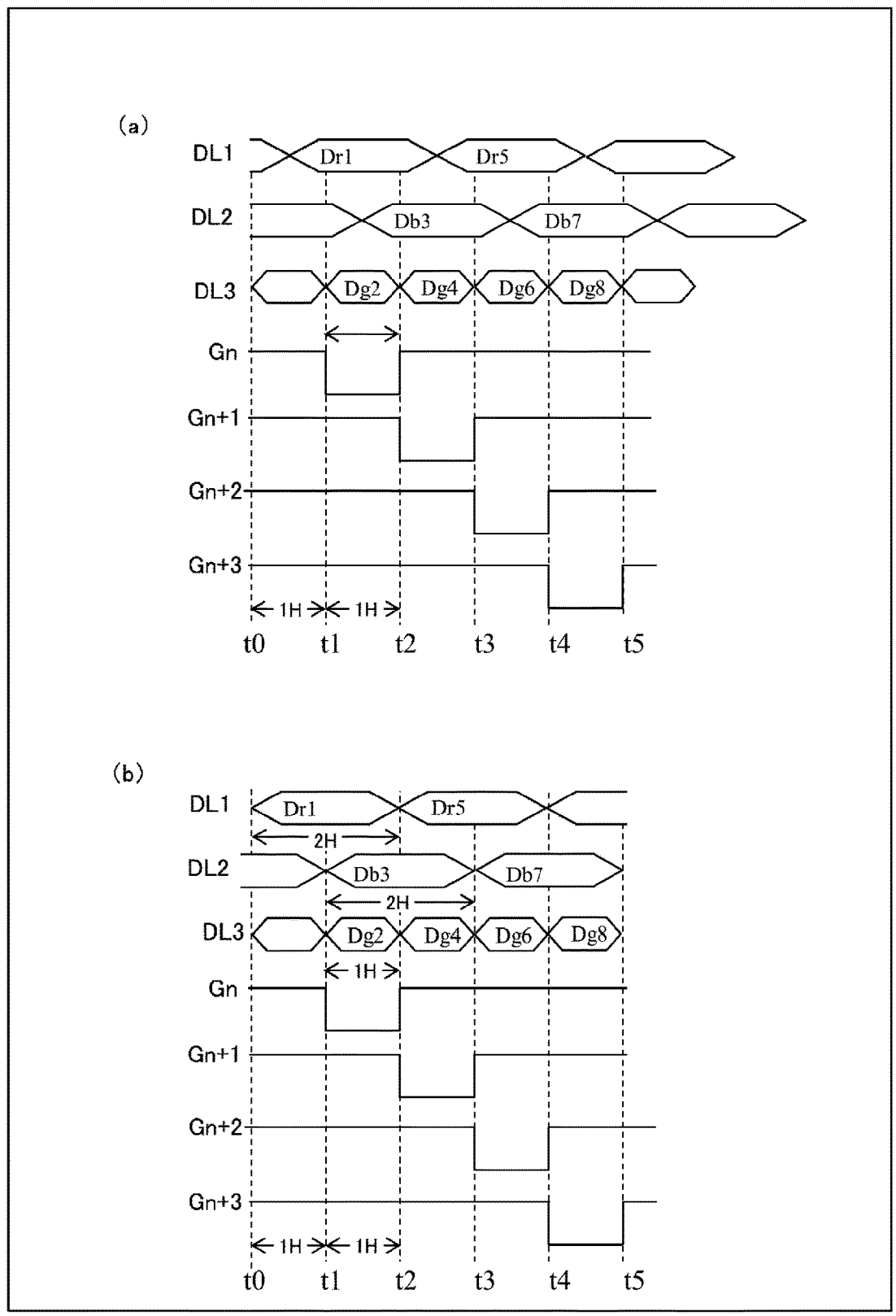
FIGS. 5(a) and 5(b) are timing charts illustrating methods of driving data signal lines and scanning signal lines according to a third embodiment.

FIGS. 5(a) and 5(b) are timing charts illustrating methods of driving data signal lines and scanning signal lines according to the third embodiment. The driving methods according to the first embodiment and the second embodiment can also be modified as illustrated in FIG. 5(a). In this case, the data signal line drive circuit SD is controlled such that the start timing of supplying the data signal Dr5 written to the fifth subpixel circuit R5 to the first data signal line DL1 is later than the start timing t2 of supplying the data signal Dg4 written to the fourth subpixel circuit G4 to the third data signal line DL3, and is earlier than the start timing t3 of supplying the data signal Dg6 written to the sixth subpixel circuit G6 to the third data signal line DL3.

For writing of the data signal Dr5 to the fifth subpixel circuit R5, the same data signal Dr5 can be written to the fifth subpixel circuit R5 at t3 to t4 at which the scanning signal line Gn+2 is selected, after the data signal line DL1 has been charged with the data signal Dr5 before t3. Thus, the charging rate of the fifth subpixel circuit R5 including the fifth light-emitting layer e5 of red light emission can be increased, and the luminance shift of the red light can be reduced. Even if the return of the pulse of the scanning signal line Gn+2 is slow, there is no risk that the next data signal may be picked up.

The data signal line drive circuit SD is controlled such that the start timing of supplying the data signal Db7 written to the seventh subpixel circuit B7 to the second data signal line DL2 is later than the start timing t3 of supplying the data signal Dg6 written to the sixth subpixel circuit G6 to the third data signal line DL3, and is earlier than the start timing t4 of supplying the data signal Dg8 written to the eighth subpixel circuit G8 to the third data signal line DL3.

For writing of the data signal Db7 to the seventh subpixel circuit B7, the same data signal Db7 can be written to the seventh subpixel circuit B7 at t4 to t5 at which the scanning signal line Gn+3 is selected, after the data signal line DL2 has been charged with the data signal Db7 before t4. Thus, the charging rate of the seventh subpixel circuit B7 including the seventh light-emitting layer e7 of blue light emission can be increased, and the luminance shift of the blue light can be reduced. Even if the return of the pulse of the scanning signal line Gn+3 is slow, there is no risk that the next data signal may be picked up.

The driving methods according to the first embodiment and the second embodiment can also be modified as illustrated in FIG. 5(b). In this case, the data signal line drive circuit SD is controlled such that the start timing of supplying the data signal Dr5 written to the fifth subpixel circuit R5 to the first data signal line DL1 is the same as the start timing t2 of supplying the data signal Dg4 written to the fourth subpixel circuit G4 to the third data signal line DL3, and is earlier than the start timing t3 of supplying the data signal Dg6 written to the sixth subpixel circuit G6 to the third data signal line DL3.

For writing of the data signal Dr5 to the fifth subpixel circuit R5, the same data signal Dr5 can be written to the fifth subpixel circuit R5 at t3 to t4 at which the scanning signal line Gn+2 is selected, after the data signal line DL1 has been charged with the data signal Dr5 at t2 to t3. Thus, the charging rate of the fifth subpixel circuit R5 including the fifth light-emitting layer e5 of red light emission can be increased, and the luminance shift of the red light can be reduced.

The data signal line drive circuit SD is controlled such that the start timing of supplying the data signal Db7 written to the seventh subpixel circuit B7 to the second data signal line DL2 is the same as the start timing t3 of supplying the data signal Dg6 written to the sixth subpixel circuit G6 to the third data signal line DL3, and is earlier than the start timing t4 of supplying the data signal Dg8 written to the eighth subpixel circuit G8 to the third data signal line DL3.

For writing of the data signal Db7 to the seventh subpixel circuit B7, the same data signal Db7 can be written to the seventh subpixel circuit B7 at t4 to t5 at which the scanning signal line Gn+3 is selected, after the data signal line DL2 has been charged with the data signal Db7 at t3 to t4. Thus, the charging rate of the seventh subpixel circuit B7 including the seventh light-emitting layer e7 of blue light emission can be increased, and the luminance shift of the blue light can be reduced.

For each of the first data signal line DL1 and the second data signal line DL2 according to the third embodiment, the corresponding data signal may be supplied in the first 1H of the one period 2H, and the supply of the data signal may be stopped in the second 1H, or the corresponding data signal may be supplied over all of the one period 2H.

Fourth Embodiment

Figure 6:
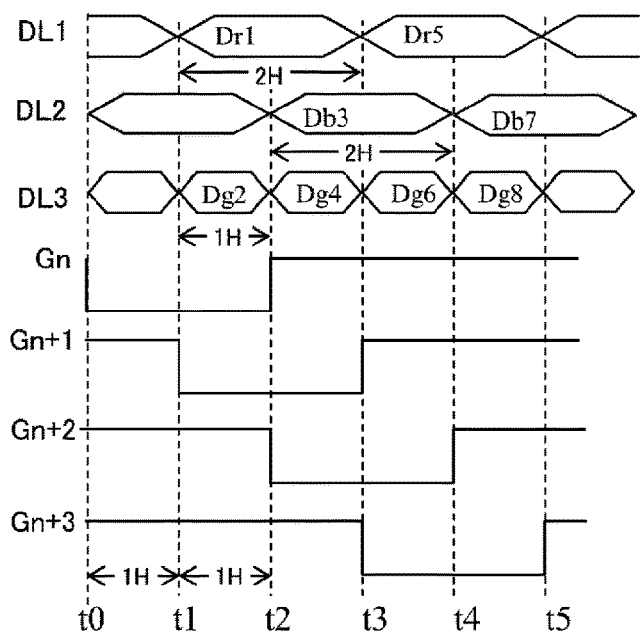
FIGS. 6(a) and 6(b) are timing charts illustrating methods of driving data signal lines and scanning signal lines according to a fourth embodiment.
Figure 6:
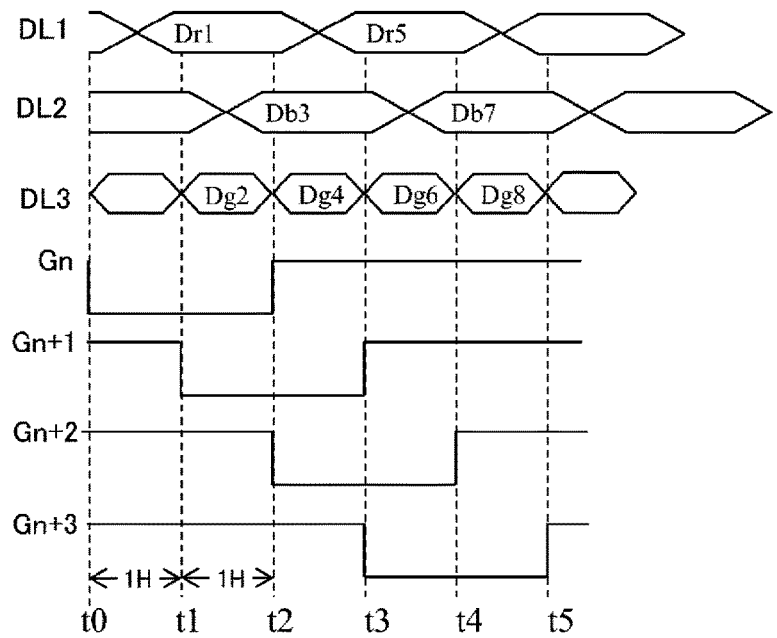

FIGS. 6(a) and 6(b) are timing charts illustrating methods of driving data signal lines and scanning signal lines according to the fourth embodiment. The driving methods illustrated in FIG. 3(b) and FIG. 4(b) can also be modified as illustrated in FIG. 6(a). In other words, the continuous select periods of scanning signal lines are overlapped. For example, the second half of the select period of the nth scanning signal line Gn overlaps (in time) with the first half of the select period of the (n+1)th scanning signal line Gn+1, the second half of the select period of the scanning signal line Gn+1 overlaps with the first half of the select period of the scanning signal line Gn+2, and the second half of the select period of the scanning signal line Gn+2 overlaps with the first half of the select period of the scanning signal line Gn+3.

In this way, for the fifth subpixel circuit R5, the data signal Dr5 can be written at t3 to t4 at which the scanning signal line Gn+2 is selected after pre-charging at t2 to t3 at which the scanning signal line Gn+2 is selected. Thus, the charging rate of the fifth subpixel circuit R5 including the fifth light-emitting layer e5 of red light emission can be increased, and the luminance shift of the red light can be reduced.

For the seventh subpixel circuit B7, the data signal Db7 can be written at t4 to t5 at which the scanning signal line Gn+3 is selected after pre-charging at t3 to t4 at which the scanning signal line Gn+3 is selected. Thus, the charging rate of the seventh subpixel circuit B7 including the seventh light-emitting layer e7 of blue light emission can be increased, and the luminance shift of the blue light can be reduced.

Note that, for the sixth subpixel circuit G6, the data signal Dg6 is written at t3 to t4 after the data signal Dg4 is pre-charged at t2 to t3.

The driving method illustrated in FIG. 5(a) can also be modified as illustrated in FIG. 6(b). In other words, the continuous select periods of scanning signal lines are overlapped.

In this way, for the fifth subpixel circuit R5, the data signal Dr5 can be written at t3 to t4 at which the scanning signal line Gn+2 is selected after pre-charging at t2 to t3 at which the scanning signal line Gn+2 is selected. Thus, the charging rate of the fifth subpixel circuit R5 including the fifth light-emitting layer e5 of red light emission can be increased, and the luminance shift of the red light can be reduced.

For the seventh subpixel circuit B7, the data signal Db7 can be written at t4 to t5 at which the scanning signal line Gn+3 is selected after pre-charging at t3 to t4 at which the scanning signal line Gn+3 is selected. Thus, the charging rate of the seventh subpixel circuit B7 including the seventh light-emitting layer e7 of blue light emission can be increased, and the luminance shift of the blue light can be reduced.

Fifth Embodiment

Figure 7:
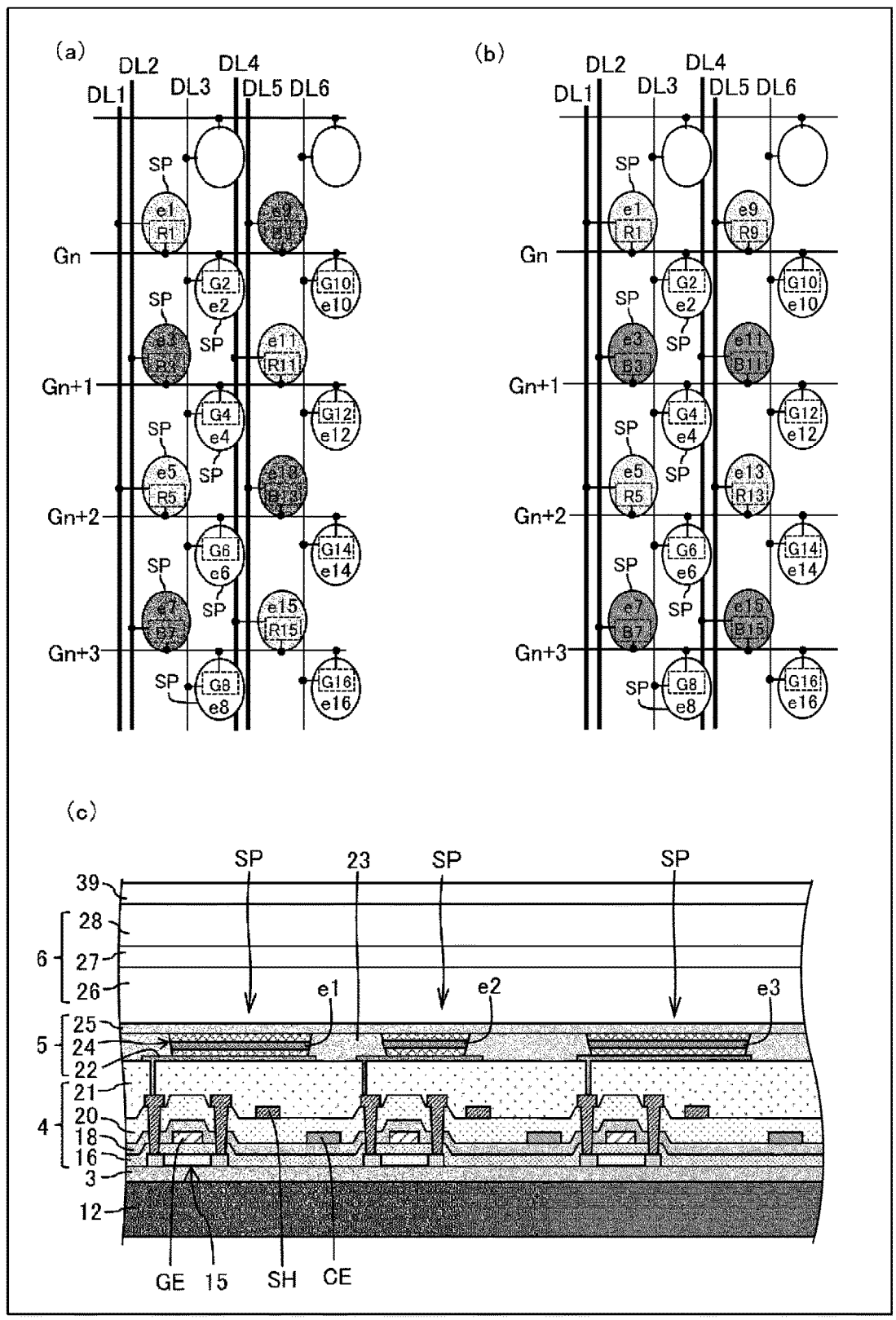
FIGS. 7(a) and 7(b) are schematic plan views illustrating configuration examples according to a fifth embodiment.
FIG. 7(c) is a cross-sectional view illustrating another configuration example according to the fifth embodiment.

FIGS. 7(a) and 7(b) are schematic plan views illustrating configuration examples according to the fifth embodiment, and FIG. 7(c) is a cross-sectional view illustrating another configuration example according to the fifth embodiment. In the first to fourth embodiments, as illustrated in FIGS. 7(a) and 7(b), the width of the data signal line DL1 that connects to the subpixel circuits R1 and R5 including the light-emitting layers e1 and e5 that emit light of a first color (for example, red color) and the width of the data signal line DL2 that connects to the subpixel circuits B3 and B7 including the light-emitting layers e3 and e7 that emit light of a second color (for example, blue color) may be larger than the width of the data signal line DL3 that connects to the subpixel circuits G2, G4, G6, and G8 including the light-emitting layers e2, e4, e6, and e8 that emit light of a third color (for example, green color). In this way, the charging rate of the subpixel circuits including the light-emitting layers of red light emission and the subpixel circuits including the light-emitting layers of blue light emission can be further increased.

In the first to fourth embodiments, at least one of the wiring capacity of the data signal line DL1 that connects to the subpixels including the light-emitting layers e1 and e5 that emit light of a first color (for example, red color) and the wiring capacity of the data signal line DL2 that connects to the subpixels including the light-emitting layers e3 and e7 that emit light of a second color (for example, blue color) may be configured to be greater than the wiring capacity of the data signal line DL3 that connects to the subpixels including the light-emitting layers e2, e4, e6, and e8 that emit light of a third color (for example, green color). The configurations of the first to fourth embodiments are considered suitable because data signal lines having large wiring capacity require time for charging itself.

In the first to fourth embodiments, as illustrated in FIG. 7(c), the area of the opening portion exposing the first electrode 22 in a subpixel SP including the light-emitting layer e2 that emits light of a third color (for example, green color) may be configured to be smaller than the area of the opening portion exposing the first electrode 22 in a subpixel SP including the light-emitting layer e1 that emits light of a first color (for example, red color) and the area of the opening portion exposing the first electrode 22 in a subpixel SP including the light-emitting layer e3 that emits light of a second color (for example, blue color). The configurations of the first to fourth embodiments are considered suitable because subpixels having large opening portions increase the data signals (signal voltage) and require time for charging the subpixel circuits.

Sixth Embodiment

Figure 8:
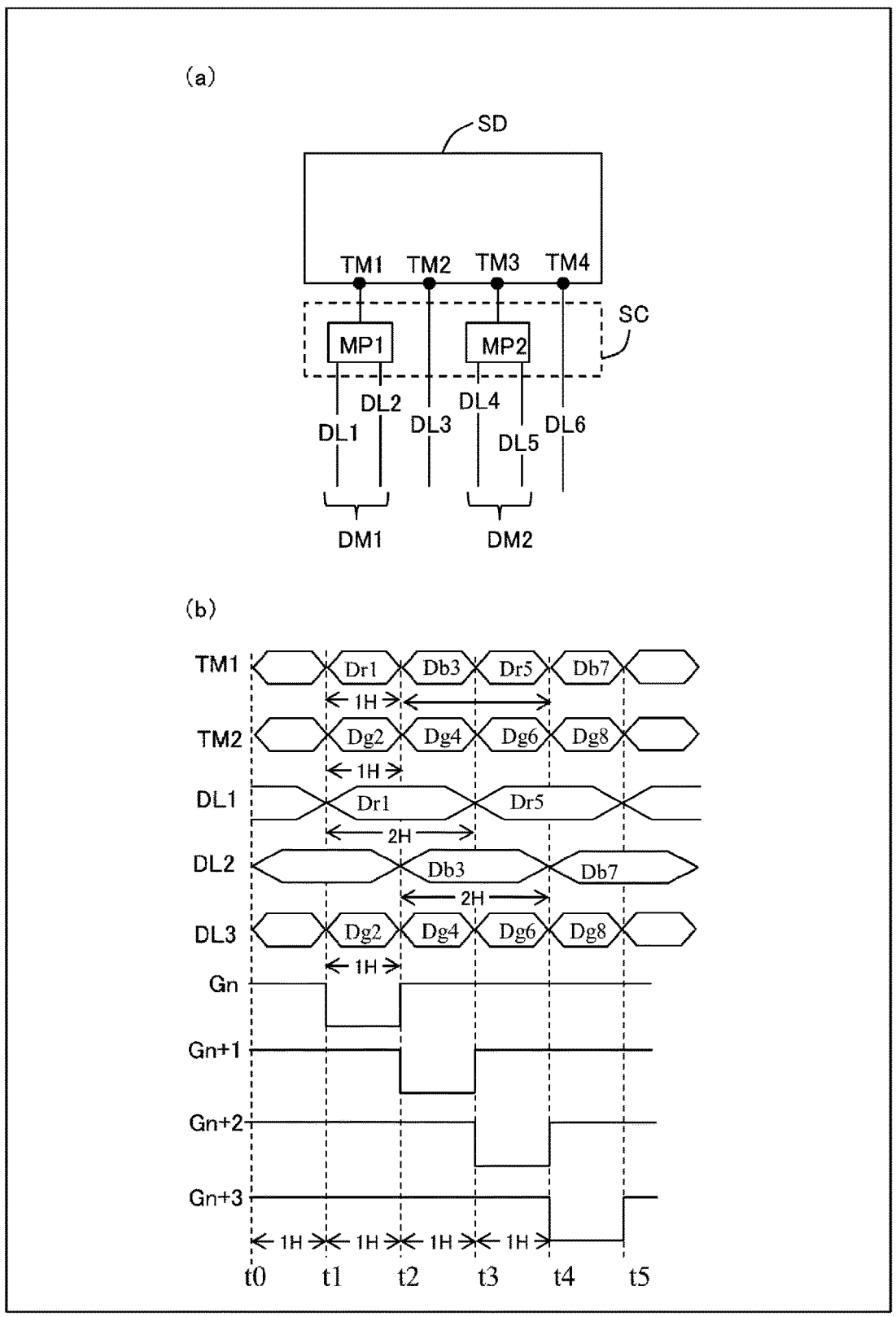
FIG. 8(a) is a schematic diagram illustrating a configuration around a data signal line drive circuit.
FIG. 8(b) is a flowchart illustrating a method of driving the data signal line drive circuit.

FIG. 8(a) is a schematic diagram illustrating a configuration around the data signal line drive circuit, and FIG. 8(b) is a flowchart illustrating a method of driving the data signal line drive circuit. As illustrated in FIG. 8(a), the signal line drive circuit SD used in the first to fifth embodiments may include a plurality of output terminals TM1 and TM3 corresponding respectively to a plurality of data signal line groups DM1 and DM2 obtained by grouping a plurality of data signal lines DL1, DL2, DL4, and DL5 with two of data signal lines as one group, and may be configured to output two data signals supplied to two data signal lines of a corresponding data signal line group in a time division manner from each output terminal. In this case, a selection output circuit SC including a plurality of demultiplexers MP1 and MP2 connected to the plurality of output terminals (TM1 and TM3) and corresponding respectively to the plurality of data signal line groups DM1 and DM2 can be connected to the signal line drive circuit SD.

The output period of the output terminal TM1 of the signal line drive circuit SD is 1H, and the data signals Dr1, Db3, Dr5, and Db7 are output to the demultiplexer MP1 in this order. The demultiplexer MP1 switches (divides up) the data signals Dr1 and Dr5 corresponding to the first color (for example, red color) and the data signals Db3 and Db7 corresponding to the second color (for example, blue color) in a time division manner to supply to the data signal lines DL1 and DL2.

The output period of the output terminal TM2 of the signal line drive circuit SD is 1H, and the data signals Dg2, Dg4, Dg6, and Dg8 corresponding to the third color (for example, green color) are supplied to the data signal line DL3 in this order. That is, the data signal corresponding to the third color is supplied directly from the terminal TM2 of the data signal line drive circuit SD without passing through the demultiplexer MP.

The embodiments described above are for the purpose of illustration and description and are not intended to be limiting. It will be apparent to those skilled in the art that many variations will be possible in accordance with these examples and descriptions.

Supplement

First Aspect

A display device including:

a plurality of data signal lines;

a plurality of scanning signal lines; and a plurality of subpixels, wherein each subpixel of the plurality of subpixels includes a first electrode, a cover film including an opening portion exposing the first electrode, a light-emitting layer having an island shape, a second electrode, and a subpixel circuit connected to the corresponding data signal line and the corresponding scanning signal line, the plurality of subpixels include a first subpixel circuit and a second subpixel circuit connected to an nth scanning signal line, a third subpixel circuit and a fourth subpixel circuit connected to an (n+1)th scanning signal line, a fifth subpixel circuit and a sixth subpixel circuit connected to an (n+2)th scanning signal line, a seventh subpixel circuit and an eighth subpixel circuit connected to an (n+3)th scanning signal line, a first light-emitting layer having an island shape and corresponding to the first subpixel circuit, a second light-emitting layer having an island shape and corresponding to the second subpixel circuit, a third light-emitting layer having an island shape and corresponding to the third subpixel circuit, a fourth light-emitting layer having an island shape and corresponding to the fourth subpixel circuit, a fifth light-emitting layer having an island shape and corresponding to the fifth subpixel circuit, a sixth light-emitting layer having an island shape and corresponding to the sixth subpixel circuit, a seventh light-emitting layer having an island shape and corresponding to the seventh subpixel circuit, and an eighth light-emitting layer having an island shape and corresponding to the eighth subpixel circuit, the first light-emitting layer, the third light-emitting layer, the fifth light-emitting layer, and the seventh light-emitting layer are adjacent in a column direction, the second light-emitting layer, the fourth light-emitting layer, the sixth light-emitting layer, and the eighth light-emitting layer are adjacent in a column direction, the first light-emitting layer is diagonally adjacent to the second light-emitting layer, the third light-emitting layer is diagonally adjacent to the second light-emitting layer and the fourth light-emitting layer, the fifth light-emitting layer is diagonally adjacent to the fourth light-emitting layer and the sixth light-emitting layer, the seventh light-emitting layer is diagonally adjacent to the sixth light-emitting layer and the eighth light-emitting layer, the first light-emitting layer and the fifth light-emitting layer are configured to emit light of a first color, the third light-emitting layer and the seventh light-emitting layer are configured to emit light of a second color different from the first color, the second light-emitting layer, the fourth light-emitting layer, the sixth light-emitting layer, and the eighth light-emitting layer are configured to emit light of a third color different from the first color and the second color, the plurality of data signal lines include a first data signal line, a second data signal line, and a third data signal line, the first subpixel circuit and the fifth subpixel circuit are connected to the first data signal line, the third subpixel circuit and the seventh subpixel circuit are connected to the second data signal line, and the second subpixel circuit, the fourth subpixel circuit, the sixth subpixel circuit, and the eighth subpixel circuit are connected to the third data signal line.

Second Aspect

The display device according to the first aspect, for example, wherein the plurality of subpixels include a ninth subpixel circuit and a 10th subpixel circuit connected to the nth scanning signal line, a 11th subpixel circuit and a 12th subpixel circuit connected to the (n+1)th scanning signal line, a 13th subpixel circuit and a 14th subpixel circuit connected to the (n+2)th scanning signal line, a 15th subpixel circuit and a 16th subpixel circuit connected to the (n+3)th scanning signal line, a ninth light-emitting layer having an island shape and corresponding to the ninth subpixel circuit, a 10th light-emitting layer having an island shape and corresponding to the 10th subpixel circuit, a 11th light-emitting layer having an island shape and corresponding to the 11th subpixel circuit, a 12th light-emitting layer having an island shape and corresponding to the 12th subpixel circuit, a 13th light-emitting layer having an island shape and corresponding to the 13th subpixel circuit, a 14th light-emitting layer having an island shape and corresponding to the 14th subpixel circuit, a 15th light-emitting layer having an island shape and corresponding to the 15th subpixel circuit, and a 16th light-emitting layer having an island shape and corresponding to the 16th subpixel circuit, the ninth light-emitting layer, the 11th light-emitting layer, the 13th light-emitting layer, and the 15th light-emitting layer are adjacent in a column direction, the 10th light-emitting layer, the 12th light-emitting layer, the 14th light-emitting layer, and the 16th light-emitting layer are adjacent in a column direction, the ninth light-emitting layer is diagonally adjacent to the second light-emitting layer and the 10th light-emitting layer, the 11th light-emitting layer is diagonally adjacent to the second light-emitting layer, the fourth light-emitting layer, the 10th light-emitting layer, and the 12th light-emitting layer, the 13th light-emitting layer is diagonally adjacent to the fourth light-emitting layer, the sixth light-emitting layer, the 12th light-emitting layer, and the 14th light-emitting layer, the 15th light-emitting layer is diagonally adjacent to the sixth light-emitting layer, the eighth light-emitting layer, the 14th light-emitting layer, and the 16th light-emitting layer, the 11th light-emitting layer and the 15th light-emitting layer are configured to emit light of the first color, the ninth light-emitting layer and the 13th light-emitting layer are configured to emit light of the second color, the 10th light-emitting layer, the 12th light-emitting layer, the 14th light-emitting layer, and the 16th light-emitting layer are configured to emit light of the third color, the plurality of data signal lines include a fourth data signal line, a fifth data signal line, and a sixth data signal line, the 11th subpixel circuit and the 15th subpixel circuit are connected to the fourth data signal line, the ninth subpixel circuit and the 13th subpixel circuit are connected to the fifth data signal line, and the 10th subpixel circuit, the 12th subpixel circuit, the 14th subpixel circuit, and the 16th subpixel circuit are connected to the sixth data signal line.

Third Aspect

The display device according to the first aspect, for example, wherein the plurality of subpixels include a ninth subpixel circuit and a 10th subpixel circuit connected to the nth scanning signal line, a 11th subpixel circuit and a 12th subpixel circuit connected to the (n+1)th scanning signal line, a 13th subpixel circuit and a 14th subpixel circuit connected to the (n+2)th scanning signal line, a 15th subpixel circuit and a 16th subpixel circuit connected to the (n+3)th scanning signal line, a ninth light-emitting layer having an island shape and corresponding to the ninth subpixel circuit, a 10th light-emitting layer having an island shape and corresponding to the 10th subpixel circuit, a 11th light-emitting layer having an island shape and corresponding to the 11th subpixel circuit, a 12th light-emitting layer having an island shape and corresponding to the 12th subpixel circuit, a 13th light-emitting layer having an island shape and corresponding to the 13th subpixel circuit, a 14th light-emitting layer having an island shape and corresponding to the 14th subpixel circuit, a 15th light-emitting layer having an island shape and corresponding to the 15th subpixel circuit, and a 16th light-emitting layer having an island shape and corresponding to the 16th subpixel circuit, the ninth light-emitting layer, the 11th light-emitting layer, the 13th light-emitting layer, and the 15th light-emitting layer are adjacent in a column direction, the 10th light-emitting layer, the 12th light-emitting layer, the 14th light-emitting layer, and the 16th light-emitting layer are adjacent in a column direction, the ninth light-emitting layer is diagonally adjacent to the second light-emitting layer and the 10th light-emitting layer, the 11th light-emitting layer is diagonally adjacent to the second light-emitting layer, the fourth light-emitting layer, the 10th light-emitting layer, and the 12th light-emitting layer, the 13th light-emitting layer is diagonally adjacent to the fourth light-emitting layer, the sixth light-emitting layer, the 12th light-emitting layer, and the 14th light-emitting layer, the 15th light-emitting layer is diagonally adjacent to the sixth light-emitting layer, the eighth light-emitting layer, the 14th light-emitting layer, and the 16th light-emitting layer, the ninth light-emitting layer and the 13th light-emitting layer are configured to emit light of the first color, the 11th light-emitting layer and the 15th light-emitting layer are configured to emit light of the second color, the 10th light-emitting layer, the 12th light-emitting layer, the 14th light-emitting layer, and the 16th light-emitting layer are configured to emit light of the third color, the plurality of data signal lines include a fourth data signal line, a fifth data signal line, and a sixth data signal line, the ninth subpixel circuit and the 13th subpixel circuit are connected to the fourth data signal line, the 11th subpixel circuit and the 15th subpixel circuit are connected to the fifth data signal line, and the 10th subpixel circuit, the 12th subpixel circuit, the 14th subpixel circuit, and the 16th subpixel circuit are connected to the sixth data signal line.

Fourth Aspect

The display device according to any one of the first to third aspects, for example, including a data signal line drive circuit configured to supply data signals to the plurality of data signal lines based on image data, wherein a holding capacitor and a drive transistor are included in each of the subpixel circuits, a data signal is written to the holding capacitor when a corresponding scanning signal line is selected, and the drive transistor is driven in accordance with the data signal written, and the data signal line drive circuit is controlled such that a start timing of supplying a data signal written to the fifth subpixel circuit to the first data signal line is at or after a start timing of supplying a data signal written to the fourth subpixel circuit to the third data signal line, and is at or before a start timing of supplying a data signal written to the sixth subpixel circuit to the third data signal line.

Fifth Aspect

The display device according to the fourth aspect, for example, wherein the data signal line drive circuit is controlled such that the start timing of supplying the data signal written to the fifth subpixel circuit to the first data signal line is later than the start timing of supplying the data signal written to the fourth subpixel circuit to the third data signal line, and is the same as the start timing of supplying the data signal written to the sixth subpixel circuit to the third data signal line.

Sixth Aspect

The display device according to the fourth aspect, for example, wherein the data signal line drive circuit is controlled such that the start timing of supplying the data signal written to the fifth subpixel circuit to the first data signal line is later than the start timing of supplying the data signal written to the fourth subpixel circuit to the third data signal line, and is earlier than the start timing of supplying the data signal written to the sixth subpixel circuit to the third data signal line.

Seventh Aspect

The display device according to the fourth aspect, for example, wherein the data signal line drive circuit is controlled such that the start timing of supplying the data signal written to the fifth subpixel circuit to the first data signal line is the same as the start timing of supplying the data signal written to the fourth subpixel circuit to the third data signal line, and is earlier than the start timing of supplying the data signal written to the sixth subpixel circuit to the third data signal line.

Eighth Aspect

The display device according to the fourth aspect, for example, wherein the data signal line drive circuit is controlled such that a start timing of supplying a data signal written to the seventh subpixel circuit to the second data signal line is at or after the start timing of supplying a data signal written to the sixth subpixel circuit to the third data signal line, and is at or before a start timing of supplying a data signal written to the eighth subpixel circuit to the third data signal line.

Ninth Aspect

The display device according to the eighth aspect, for example, wherein the data signal line drive circuit is controlled such that the start timing of supplying the data signal written to the seventh subpixel circuit to the second data signal line is later than the start timing of supplying the data signal written to the sixth subpixel circuit to the third data signal line, and is the same as the start timing of supplying the data signal written to the eighth subpixel circuit to the third data signal line.

10th Aspect

The display device according to the eighth aspect, for example, wherein the data signal line drive circuit is controlled such that the start timing of supplying the data signal written to the seventh subpixel circuit to the second data signal line is later than the start timing of supplying the data signal written to the sixth subpixel circuit to the third data signal line, and is earlier than the start timing of supplying the data signal written to the eighth subpixel circuit to the third data signal line.

11th Aspect

The display device according to the eighth aspect, for example, wherein the data signal line drive circuit is controlled such that the start timing of supplying the data signal written to the seventh subpixel circuit to the second data signal line is the same as the start timing of supplying the data signal written to the sixth subpixel circuit to the third data signal line, and is earlier than the start timing of supplying the data signal written to the eighth subpixel circuit to the third data signal line.

12th Aspect

The display device according to any one of the first to 11th aspects, for example, wherein drive frequencies of the first data signal line and the second data signal line is ½ of a drive frequency of the third data signal line.

13th Aspect

The display device according to any one of the first to 12th aspects, for example, wherein a select period of the nth scanning signal line overlaps with a select period of the (n+1)th scanning signal line.

14th Aspect

The display device according to any one of the first to 13th aspects, for example, wherein at least one of a width of the data signal line connected to the subpixel including the light-emitting layer emitting light of the first color and a width of the data signal line connected to the subpixel including the light-emitting layer emitting light of the second color is greater than a width of the data signal line connected to the subpixel including the light-emitting layer emitting light of the third color.

15th Aspect

The display device according to any one of the first to 14th aspects, for example, wherein at least one of a wiring capacity of the data signal line connected to the subpixel including the light-emitting layer emitting light of the first color and a wiring capacity of the data signal line connected to the subpixel including the light-emitting layer emitting light of the second color is greater than a wiring capacity of the data signal line connected to the subpixel including the light-emitting layer emitting light of the third color.

16th Aspect

The display device according to any one of the first to 15th aspects, for example, wherein the third color is green.

17th Aspect

The display device according to any one of the first to 16th aspects, for example, wherein the first color is red or blue.

18th Aspect

The display device according to any one of the first to 17th aspects, for example, wherein an area of the opening portion exposing the first electrode in the subpixel including the light-emitting layer emitting light of the third color is smaller than an area of the opening portion exposing the first electrode in the subpixel including the light-emitting layer emitting light of the first color and an area of the opening portion exposing the first electrode in the subpixel including the light-emitting layer emitting light of the second color.

19th Aspect

The display device according to any one of the first to third aspects, for example, including:

a data signal line drive circuit including a plurality of output terminals corresponding respectively to a plurality of data signal line groups obtained by grouping the plurality of data signal lines with a predetermined number not less than two of data signal lines of the plurality of data signal lines as one group, the data signal line drive circuit being configured to output, from each of the plurality of output terminals, a predetermined number of data signals supplied to the predetermined number of data signal lines of a corresponding data signal line group in a time division manner; and a selection output circuit including a plurality of demultiplexers connected to the plurality of output terminals and corresponding respectively to the plurality of data signal line groups.

20th Aspect

The display device according to the 19th aspect, for example, wherein data signals corresponding to the first color and data signals corresponding to the second color are supplied to corresponding data signal lines via the plurality of demultiplexers configured to switch between the data signals corresponding to the first color and the data signals corresponding to the second color.

21st Aspect

The display device according to the 20th aspect, for example, wherein data signals corresponding to the third color are supplied to data signal lines without passing through the plurality of demultiplexers.

22nd Aspect

A display device including:

a plurality of data signal lines extending in a column direction;

a plurality of scanning signal lines extending in a row direction;

a plurality of light-emitting layers each having an island shape; and subpixel circuits corresponding to the plurality of light-emitting layers, wherein the plurality of light-emitting layers include five light-emitting layers including four light-emitting layers arranged in two rows and two columns, and one light-emitting layer diagonally adjacent to each of the four light-emitting layers, two of the four light-emitting layers are configured to emit light of a first color and remaining two of the four light-emitting layers are configured to emit light of a second color, the one light-emitting layer is configured to emit light of a third color, three subpixel circuits corresponding to three light-emitting layers including the one light-emitting layer and two light-emitting layers adjacent in a row direction among the five light-emitting layers are connected to an identical scanning signal line, and four subpixel circuits corresponding to four light-emitting layers including the one light-emitting layer and three light-emitting layers diagonally adjacent to the one light-emitting layer among the five light-emitting layers are connected respectively to four different data signal lines provided to correspond to the four subpixel circuits.

The invention claimed is:

1. A display device comprising:

a plurality of data signal lines;

a plurality of scanning signal lines; and a plurality of subpixels, wherein each subpixel of the plurality of subpixels includes a first electrode, a cover film including an opening portion exposing the first electrode, a light-emitting layer having an island shape, a second electrode, and a subpixel circuit connected to the corresponding data signal line and the corresponding scanning signal line, the plurality of subpixels include a first subpixel circuit and a second subpixel circuit connected to an nth scanning signal line, a third subpixel circuit and a fourth subpixel circuit connected to an (n+1)th scanning signal line, a fifth subpixel circuit and a sixth subpixel circuit connected to an (n+2)th scanning signal line, a seventh subpixel circuit and an eighth subpixel circuit connected to an (n+3)th scanning signal line, a first light-emitting layer having an island shape and corresponding to the first subpixel circuit, a second light-emitting layer having an island shape and corresponding to the second subpixel circuit, a third light-emitting layer having an island shape and corresponding to the third subpixel circuit, a fourth light-emitting layer having an island shape and corresponding to the fourth subpixel circuit, a fifth light-emitting layer having an island shape and corresponding to the fifth subpixel circuit, a sixth light-emitting layer having an island shape and corresponding to the sixth subpixel circuit, a seventh light-emitting layer having an island shape and corresponding to the seventh subpixel circuit, and an eighth light-emitting layer having an island shape and corresponding to the eighth subpixel circuit, the first light-emitting layer, the third light-emitting layer, the fifth light-emitting layer, and the seventh light-emitting layer are adjacent in a column direction, the second light-emitting layer, the fourth light-emitting layer, the sixth light-emitting layer, and the eighth light-emitting layer are adjacent in a column direction, the first light-emitting layer is diagonally adjacent to the second light-emitting layer, the third light-emitting layer is diagonally adjacent to the second light-emitting layer and the fourth light-emitting layer, the fifth light-emitting layer is diagonally adjacent to the fourth light-emitting layer and the sixth light-emitting layer, the seventh light-emitting layer is diagonally adjacent to the sixth light-emitting layer and the eighth light-emitting layer, the first light-emitting layer and the fifth light-emitting layer are configured to emit light of a first color, the third light-emitting layer and the seventh light-emitting layer are configured to emit light of a second color different from the first color, the second light-emitting layer, the fourth light-emitting layer, the sixth light-emitting layer, and the eighth light-emitting layer are configured to emit light of a third color different from the first color and the second color, the plurality of data signal lines include a first data signal line, a second data signal line, and a third data signal line, the first subpixel circuit and the fifth subpixel circuit are connected to the first data signal line, the third subpixel circuit and the seventh subpixel circuit are connected to the second data signal line, and the second subpixel circuit, the fourth subpixel circuit, the sixth subpixel circuit, and the eighth subpixel circuit are connected to the third data signal line, wherein drive frequencies of the first data signal line and the second data signal line is ½ of a drive frequency of the third data signal line.

2. The display device according to claim 1, wherein the plurality of subpixels include a ninth subpixel circuit and a 10th subpixel circuit connected to the nth scanning signal line, a 11th subpixel circuit and a 12th subpixel circuit connected to the (n+1)th scanning signal line, a 13th subpixel circuit and a 14th subpixel circuit connected to the (n+2)th scanning signal line, a 15th subpixel circuit and a 16th subpixel circuit connected to the (n+3)th scanning signal line, a ninth light-emitting layer having an island shape and corresponding to the ninth subpixel circuit, a 10th light-emitting layer having an island shape and corresponding to the 10th subpixel circuit, a 11th light-emitting layer having an island shape and corresponding to the 11th subpixel circuit, a 12th light-emitting layer having an island shape and corresponding to the 12th subpixel circuit, a 13th light-emitting layer having an island shape and corresponding to the 13th subpixel circuit, a 14th light-emitting layer having an island shape and corresponding to the 14th subpixel circuit, a 15th light-emitting layer having an island shape and corresponding to the 15th subpixel circuit, and a 16th light-emitting layer having an island shape and corresponding to the 16th subpixel circuit, the ninth light-emitting layer, the 11th light-emitting layer, the 13th light-emitting layer, and the 15th light-emitting layer are adjacent in a column direction, the 10th light-emitting layer, the 12th light-emitting layer, the 14th light-emitting layer, and the 16th light-emitting layer are adjacent in a column direction, the ninth light-emitting layer is diagonally adjacent to the second light-emitting layer and the 10th light-emitting layer, the 11th light-emitting layer is diagonally adjacent to the second light-emitting layer, the fourth light-emitting layer, the 10th light-emitting layer, and the 12th light-emitting layer, the 13th light-emitting layer is diagonally adjacent to the fourth light-emitting layer, the sixth light-emitting layer, the 12th light-emitting layer, and the 14th light-emitting layer, the 15th light-emitting layer is diagonally adjacent to the sixth light-emitting layer, the eighth light-emitting layer, the 14th light-emitting layer, and the 16th light-emitting layer, the 11th light-emitting layer and the 15th light-emitting layer are configured to emit light of the first color, the ninth light-emitting layer and the 13th light-emitting layer are configured to emit light of the second color, the 10th light-emitting layer, the 12th light-emitting layer, the 14th light-emitting layer, and the 16th light-emitting layer are configured to emit light of the third color, the plurality of data signal lines include a fourth data signal line, a fifth data signal line, and a sixth data signal line, the 11th subpixel circuit and the 15th subpixel circuit are connected to the fourth data signal line, the ninth subpixel circuit and the 13th subpixel circuit are connected to the fifth data signal line, and the 10th subpixel circuit, the 12th subpixel circuit, the 14th subpixel circuit, and the 16th subpixel circuit are connected to the sixth data signal line.

3. The display device according to claim 1, wherein the plurality of subpixels include a ninth subpixel circuit and a 10th subpixel circuit connected to the nth scanning signal line, a 11th subpixel circuit and a 12th subpixel circuit connected to the (n+1)th scanning signal line, a 13th subpixel circuit and a 14th subpixel circuit connected to the (n+2)th scanning signal line, a 15th subpixel circuit and a 16th subpixel circuit connected to the (n+3)th scanning signal line, a ninth light-emitting layer having an island shape and corresponding to the ninth subpixel circuit, a 10th light-emitting layer having an island shape and corresponding to the 10th subpixel circuit, a 11th light-emitting layer having an island shape and corresponding to the 11th subpixel circuit, a 12th light-emitting layer having an island shape and corresponding to the 12th subpixel circuit, a 13th light-emitting layer having an island shape and corresponding to the 13th subpixel circuit, a 14th light-emitting layer having an island shape and corresponding to the 14th subpixel circuit, a 15th light-emitting layer having an island shape and corresponding to the 15th subpixel circuit, and a 16th light-emitting layer having an island shape and corresponding to the 16th subpixel circuit, the ninth light-emitting layer, the 11th light-emitting layer, the 13th light-emitting layer, and the 15th light-emitting layer are adjacent in a column direction, the 10th light-emitting layer, the 12th light-emitting layer, the 14th light-emitting layer, and the 16th light-emitting layer are adjacent in a column direction, the ninth light-emitting layer is diagonally adjacent to the second light-emitting layer and the 10th light-emitting layer, the 11th light-emitting layer is diagonally adjacent to the second light-emitting layer, the fourth light-emitting layer, the 10th light-emitting layer, and the 12th light-emitting layer, the 13th light-emitting layer is diagonally adjacent to the fourth light-emitting layer, the sixth light-emitting layer, the 12th light-emitting layer, and the 14th light-emitting layer, the 15th light-emitting layer is diagonally adjacent to the sixth light-emitting layer, the eighth light-emitting layer, the 14th light-emitting layer, and the 16th light-emitting layer, the ninth light-emitting layer and the 13th light-emitting layer are configured to emit light of the first color, the 11th light-emitting layer and the 15th light-emitting layer are configured to emit light of the second color, the 10th light-emitting layer, the 12th light-emitting layer, the 14th light-emitting layer, and the 16th light-emitting layer are configured to emit light of the third color, the plurality of data signal lines include a fourth data signal line, a fifth data signal line, and a sixth data signal line, the ninth subpixel circuit and the 13th subpixel circuit are connected to the fourth data signal line, the 11th subpixel circuit and the 15th subpixel circuit are connected to the fifth data signal line, and the 10th subpixel circuit, the 12th subpixel circuit, the 14th subpixel circuit, and the 16th subpixel circuit are connected to the sixth data signal line.

4. The display device according to claim 1, comprising:

a data signal line drive circuit configured to supply data signals to the plurality of data signal lines based on image data, wherein a holding capacitor and a drive transistor are included in each of the subpixel circuits, a data signal is written to the holding capacitor when a corresponding scanning signal line is selected, and the drive transistor is driven in accordance with the data signal written, and the data signal line drive circuit is controlled such that a start timing of supplying a data signal written to the fifth subpixel circuit to the first data signal line is at or after a start timing of supplying a data signal written to the fourth subpixel circuit to the third data signal line, and is at or before a start timing of supplying a data signal written to the sixth subpixel circuit to the third data signal line.

5. The display device according to claim 4, wherein the data signal line drive circuit is controlled such that the start timing of supplying the data signal written to the fifth subpixel circuit to the first data signal line is later than the start timing of supplying the data signal written to the fourth subpixel circuit to the third data signal line, and is the same as the start timing of supplying the data signal written to the sixth subpixel circuit to the third data signal line.

6. The display device according to claim 4, wherein the data signal line drive circuit is controlled such that the start timing of supplying the data signal written to the fifth subpixel circuit to the first data signal line is later than the start timing of supplying the data signal written to the fourth subpixel circuit to the third data signal line, and is earlier than the start timing of supplying the data signal written to the sixth subpixel circuit to the third data signal line.

7. The display device according to claim 4, wherein the data signal line drive circuit is controlled such that the start timing of supplying the data signal written to the fifth subpixel circuit to the first data signal line is the same as the start timing of supplying the data signal written to the fourth subpixel circuit to the third data signal line, and is earlier than the start, timing of supplying the data signal written to the sixth subpixel circuit to the third data signal line.

8. The display device according to claim 4,
wherein the data signal line drive circuit is controlled such that a start timing of supplying a data signal written to the seventh subpixel circuit to the second data signal line is at or after the start timing of supplying a data signal written to the sixth subpixel circuit to the third data signal line, and is at or before a start timing of supplying a data signal written to the eighth subpixel circuit to the third data signal line.

9. The display device according to claim 8,
wherein the data signal line drive circuit is controlled such that the start timing of supplying the data signal written to the seventh subpixel circuit to the second data signal line is later than the start timing of supplying the data signal written to the sixth subpixel circuit to the third data signal line, and is the same as the start timing of supplying the data signal written to the eighth subpixel circuit to the third data signal line.

10. The display device according to claim 8,
wherein the data signal line drive circuit is controlled such that the start timing of supplying the data signal written to the seventh subpixel circuit to the second data signal line is later than the start timing of supplying the data signal written to the sixth subpixel circuit to the third data signal line, and is earlier than the start timing of supplying the data signal written to the eighth subpixel circuit to the third data signal line.

11. The display device according to claim 8,
wherein the data signal line drive circuit is controlled such that the start timing of supplying the data signal written to the seventh subpixel circuit to the second data signal line is the same as the start timing of supplying the data signal written to the sixth subpixel circuit to the third data signal line, and is earlier than the start timing of supplying the data signal written to the eighth subpixel circuit to the third data signal line.

12. The display device according to claim 1,
wherein a select period of the nth scanning signal line overlaps with a select period of the (n+1)th scanning signal line.

13. The display device according to claim 1,
wherein at least one of a width of the data signal line connected to the subpixel including the light-emitting layer emitting light of the first color and a width of the data signal line connected to the subpixel including the light-emitting layer emitting light of the second color is greater than a width of the data signal line connected to the subpixel including the light-emitting layer emitting light of the third color.

14. The display device according to claim 1,
wherein at least one of a wiring capacity of the data signal line connected to the subpixel including the light-emitting layer emitting light of the first color and a wiring capacity of the data signal line connected to the subpixel including the light-emitting layer emitting light of the second color is greater than a wiring capacity of the data signal line connected to the subpixel including the light-emitting layer emitting light of the third color.

15. The display device according to claim 1,
wherein the third color is green.

16. The display device according to claim 1, comprising:
a data signal line drive circuit including a plurality of output terminals corresponding respectively to a plurality of data signal line groups obtained by grouping the plurality of data signal lines with a predetermined number not less than two of data signal lines of the plurality of data signal lines as one group, the data signal line drive circuit being configured to output, from each output terminal of the plurality of output terminals, a predetermined number of data signals supplied to the predetermined number of data signal lines of a corresponding data signal line group in a time division manner; and
a selection output circuit including a plurality of demultiplexers connected to the plurality of output terminals and corresponding respectively to the plurality of data signal line groups.

17. The display device according to claim 16,
wherein data signals corresponding to the first color and data signals corresponding to the second color are supplied to corresponding data signal lines via the plurality of demultiplexers configured to switch between the data signals corresponding to the first color and the data signals corresponding to the second color.

18. The display device according to claim 17,
wherein data signals corresponding to the third color are supplied to data signal lines without passing through the plurality of demultiplexers.

* * * * *